(12) United States Patent
Tsuruda et al.

(10) Patent No.: US 11,544,864 B2
(45) Date of Patent: Jan. 3, 2023

(54) SHAPE CHARACTERISTIC VALUE ESTIMATION APPARATUS, SHAPE CHARACTERISTIC VALUE ESTIMATION METHOD, AND STORAGE MEDIUM

(71) Applicant: Tokyo Electron Limited, Tokyo (JP)

(72) Inventors: Toyohisa Tsuruda, Kumamoto (JP); Yusuke Yoda, Tokyo (JP); Masato Hosaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 217 days.

(21) Appl. No.: 17/109,614

(22) Filed: Dec. 2, 2020

(65) Prior Publication Data

US 2021/0201516 A1 Jul. 1, 2021

(30) Foreign Application Priority Data

Dec. 9, 2019 (JP) .............................. JP2019-222321
Sep. 4, 2020 (JP) .............................. JP2020-149180

(51) Int. Cl.
| | |
|---|---|
| *G06T 7/00* | (2017.01) |
| *G06T 7/50* | (2017.01) |
| *G06F 30/398* | (2020.01) |
| *G06T 7/90* | (2017.01) |

(52) U.S. Cl.
CPC .............. *G06T 7/50* (2017.01); *G06F 30/398* (2020.01); *G06T 7/0006* (2013.01); *G06T 7/90* (2017.01); *G06T 2207/30148* (2013.01)

(58) Field of Classification Search
CPC .... G01B 11/14; G01B 11/0016; G01C 23/00; B64G 1/58; B60K 35/00; G06N 20/00; G06N 5/046; G06T 7/50; G06T 7/0004; G09B 5/10; G03F 7/705; G03F 1/36; G03F 7/70508; G01N 21/31; H04N 5/232
USPC ............................................. 382/145; 427/10
See application file for complete search history.

(56) References Cited

U.S. PATENT DOCUMENTS

| | | | |
|---|---|---|---|
| 2020/0073256 A1* | 3/2020 | Segawa ................. | G03F 7/2022 |
| 2022/0252988 A1* | 8/2022 | Werkman ................ | G03F 7/705 |

FOREIGN PATENT DOCUMENTS

JP 2015-215193 A 12/2015

* cited by examiner

*Primary Examiner* — Phuoc H Doan
(74) *Attorney, Agent, or Firm* — Nath, Goldberg & Meyer; Jerald L. Meyer; Tanya E. Harkins

(57) ABSTRACT

An apparatus includes: a processed-image acquisition part for acquiring a processed image including image information of a surface of a substrate having a target film formed thereon; an estimation part for estimating a shape characteristic value of the target film, by applying an estimation model for estimating the shape characteristic value of the target film to the processed image; an underlying influence model creation part for creating an underlying influence model associated with a correlation between a difference between an estimation result of the shape characteristic value of the target film and a shape characteristic value of the target film acquired without using the estimation model, and information related to a color of a surface of an underlying substrate before the target film is formed, and an estimated-result correction part for correcting the estimation result of the shape characteristic value of the target film based on the underlying influence model.

7 Claims, 13 Drawing Sheets

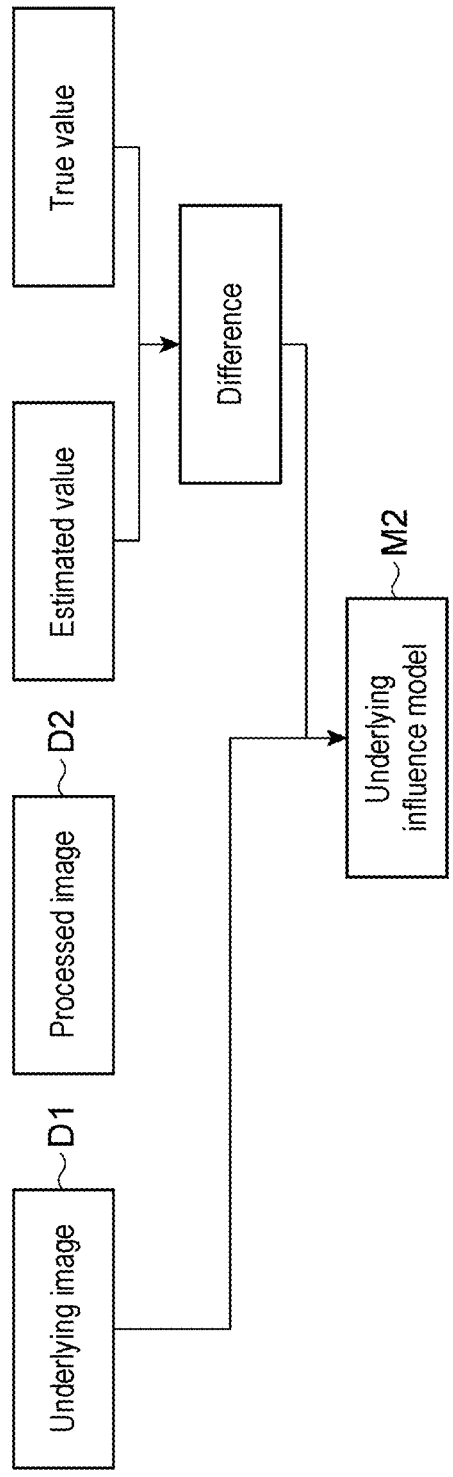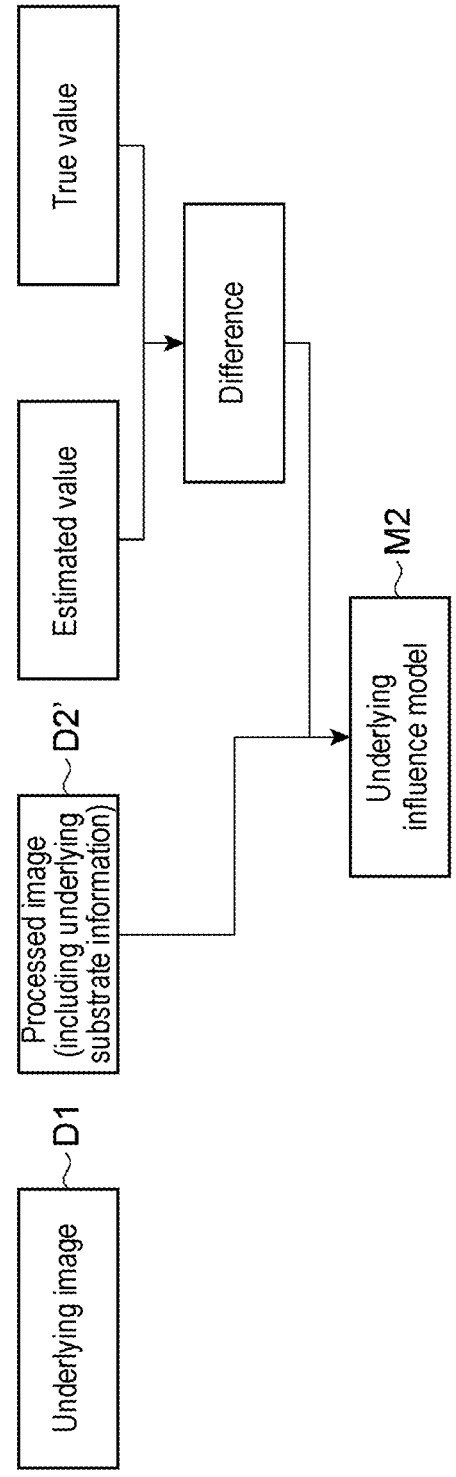

SHAPE CHARACTERISTIC VALUE ESTIMATION APPARATUS, SHAPE CHARACTERISTIC VALUE ESTIMATION METHOD, AND STORAGE MEDIUM

CROSS-REFERENCE TO RELATED APPLICATIONS

This application is based upon and claims the benefit of priority from Japanese Patent Application Nos. 2020-149180 and 2019-222321, filed on Sep. 4, 2019 and Dec. 9, 2019, respectively, the entire contents of which are incorporated herein by reference.

TECHNICAL FIELD

The present disclosure relates to a shape characteristic value estimation apparatus, a shape characteristic value estimation method, and a storage medium.

BACKGROUND

Patent Document 1 discloses a configuration in which a film thickness of a film formed on a substrate is calculated from an image obtained by capturing the surface of the substrate. In such a calculation, correlation data associating pixel values obtained from the captured image for preparation with film thickness measurement values at respective coordinates corresponding to the pixel values is used.

PRIOR ART DOCUMENTS

Patent Documents

Patent Document 1: Japanese laid-open publication No. 2015-215193

SUMMARY

According to one embodiment of the present disclosure, there is provided a shape characteristic value estimation apparatus, including: a processed-image acquisition part configured to acquire a processed image including image information related to a surface of a substrate on which a target film is formed; an estimation part configured to estimate a shape characteristic value of the target film, by applying, to the processed image, an estimation model for estimating the shape characteristic value of the target film, the estimation model being associated with a correlation between information related to a color of the surface of the substrate included in the processed image and the shape characteristic value, wherein the shape characteristic value is a characteristic value related to a shape of the target film formed on the substrate; an underlying influence model creation part configured to create an underlying influence model which is a model associated with a correlation between a difference between an estimation result of the shape characteristic value of the target film by the estimation part and a shape characteristic value of the target film acquired without using the estimation model, and information related to a color of a surface of an underlying substrate which is a substrate before the target film is formed, and an estimated-result correction part configured to correct the estimation result of the shape characteristic value of the target film by the estimation part based on the underlying influence model.

BRIEF DESCRIPTION OF DRAWINGS

The associated with drawings, which are incorporated in and constitute a part of the specification, illustrate embodiments of the present disclosure, and together with the general description given above and the detailed description of the embodiments given below, serve to explain the principles of the present disclosure.

FIGS. 13A and 13B are schematic view illustrating an example of a method of creating the underlying influence model.

DETAILED DESCRIPTION

Figure 1:
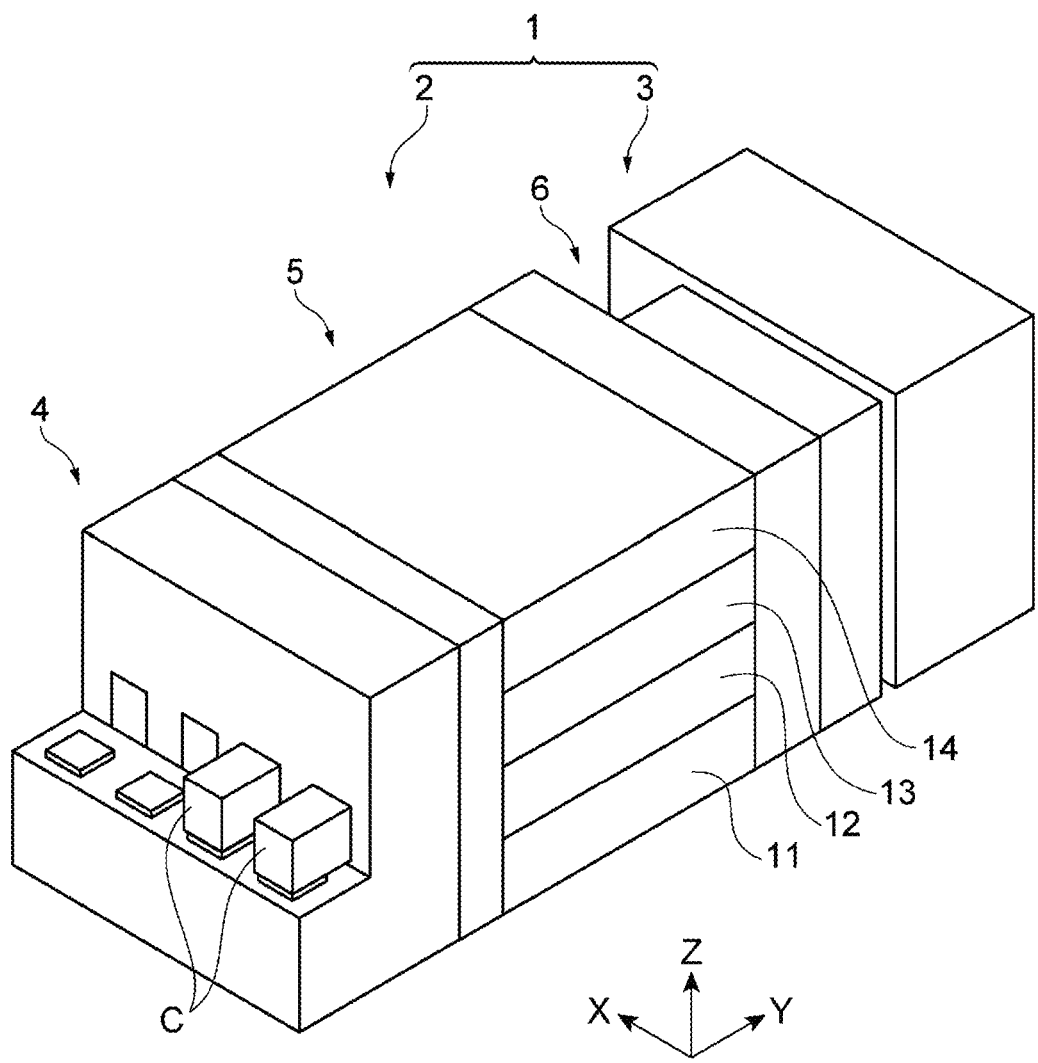
FIG. 1 is a schematic view illustrating an example of a schematic configuration of a substrate processing system.

Hereinafter, various exemplary embodiments will be described. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In one exemplary embodiment, a shape characteristic value estimation apparatus includes: a processed-image acquisition part configured to acquire a processed image including image information related to a surface of a substrate on which a target film is formed; an estimation part configured to estimate a shape characteristic value of the target film, by applying, to the processed image, an estimation model for estimating the shape characteristic value of the target film, the estimation model being associated with a correlation between information related to a color of the surface of the substrate included in the processed image and the shape characteristic value, wherein the shape characteristic value is a characteristic value related to a shape of the target film formed on the substrate; an underlying influence model creation part configured to create an underlying influence model which is a model associated with a correlation between a difference between an estimation result of the shape characteristic value of the target film by the estimation part and a shape characteristic value of the target film acquired without using the estimation model, and information related to a color of a surface of an underlying substrate which is a substrate before the target film is formed, and an estimated-result correction part configured to correct the estimation result of the shape characteristic value of the target film by the estimation part based on the underlying influence model.

According to the aforementioned shape characteristic value estimation apparatus, first, the shape characteristic value of the target film is estimated using the estimation model. Next, the underlying influence model, which is a model associated with the correlation between the difference between the estimation result of the shape characteristic value of the target film and the shape characteristic value of the target film acquired without using the estimation model, and the information related to the color of the surface of the underlying substrate before the target film is formed, is created. Then, the estimation result is corrected based on the underlying influence model. With this configuration, the variation component of the estimation result derived from the color of the underlying substrate, or the like can be corrected based on the underlying influence model. Therefore, it is possible to accurately estimate the shape characteristic value related to the shape of the target film formed on the substrate.

In the device, the shape characteristic value of the target film acquired without using the estimation model is a measured value of the shape characteristic value of the substrate on which the target film is formed.

Since the underlying influence model can be more accurately created by using the shape characteristic value of the target film used when creating the underlying influence model as the measured value of the shape characteristic value of the substrate on which the target film is formed, it is possible to accurately estimate the shape characteristic value of the target film formed on the substrate.

In the device, the estimation model is a model created also based on the information related to the color of the surface of the underlying substrate.

If the estimation model is a model created also based on the information related to the color of the surface of the underlying substrate, since the influence of the color of the underlying substrate is considered to some extent in the estimation result of the shape characteristic value by the estimation model, it is considered that the accuracy is sufficiently good. Then, since the variation component of the estimation result derived from the color of the underlying substrate, or the like, which is not completely recognized by the estimation model, can be further corrected by further performing the correction using the underlying influence model, it is possible to further improve the accuracy of the estimation result.

The device further includes an underlying image acquisition part configured to acquire an underlying image including the image information related to the surface of the underlying substrate, wherein the underlying influence model creating part is configured to create the underlying influence model using the information related to the color of the surface of the underlying substrate included in the underlying image.

In the device further including the underlying image acquisition part, the information related to the surface of the underlying substrate with a wider area included in the underlying image can be used when creating the underlying influence model using the information related to the surface of the underlying substrate included in the underlying image acquired by the underlying image acquisition part. Thus, it is possible to more accurately create the underlying influence model.

In the device, the underlying influence model creation part is configured to create the underlying influence model by using the information related to the color of the surface of the underlying substrate included in the processed image.

When creating the underlying influence model using the information related to the color of the surface of the underlying substrate included in the processed image, the underlying influence model can be created without separately preparing a configuration for acquiring the information related to the color of the surface of the underlying substrate. Therefore, it is possible to create the underlying influence model with a simpler device configuration.

In one exemplary embodiment, a shape characteristic value estimation method of estimating a shape characteristic value which is a characteristic value related to a shape of a target film formed on a substrate, includes: acquiring a processed image including image information related to a surface of the substrate on which the target film is formed; estimating a shape characteristic value of the target film, by applying, to the processed image, an estimation model for estimating the shape characteristic value of the target film, the estimation model being associated with a correlation between information related to a color of the surface of the substrate included in the processed image and the shape characteristic value which is a characteristic value related to a shape of the target film formed on the substrate; creating an underlying influence model which is a model associated with a correlation between a difference between an estimation result of the shape characteristic value of the target film and a shape characteristic value of the target film acquired without using the estimation model, and information related to a color of a surface of an underlying substrate which is a substrate before the target film is formed, and correcting the estimation result of the shape characteristic value of the target film based on the underlying influence model.

According to the aforementioned shape characteristic value estimation method, first, the shape characteristic value of the target film is estimated using the estimation model. Next, the underlying influence model, which is a model related to the correlation between the difference between the estimation result of the shape characteristic value of the target film and the shape characteristic value of the target film acquired without using the estimation model, and the information related to the color of the surface of the underlying substrate before the target film is formed, is created. Then, the estimation result is corrected based on the underlying influence model. With this configuration, the variation component of the estimation result derived from the color of the underlying substrate, or the like can be corrected based on the underlying influence model. Therefore, it is possible to accurately estimate the shape characteristic value related to the shape of the target film formed on the substrate.

In one exemplary embodiment, a storage medium is a computer-readable storage medium storing a program that causes the device to perform the shape characteristic value estimation method.

Hereinafter, various exemplary embodiments will be described in detail with reference to the drawings. Further, like or equivalent parts in each drawing will be denoted by like reference numerals.

[Substrate Processing System]

A substrate processing system 1 is a system that forms a photosensitive film on a substrate, exposes the photosensitive film, and develops the photosensitive film. The substrate to be processed is, for example, a semiconductor wafer W.

The substrate processing system 1 includes a coating/developing apparatus 2 and an exposure apparatus 3. The exposure apparatus 3 performs an exposure process on a resist film (photosensitive film) coated on the wafer W (substrate). Specifically, the exposure apparatus 3 irradiates an exposure target portion of the resist film with energy rays by a method such as liquid immersion exposure or the like. The coating/developing apparatus 2 performs a process of coating a resist film on the surface of the wafer W (substrate) before the exposure process performed by the exposure apparatus 3, and performs a developing process on the resist film after the exposure process. By performing the series of processes, the resist film having a predetermined pattern is formed.

[Substrate Processing Apparatus]

Figure 2:
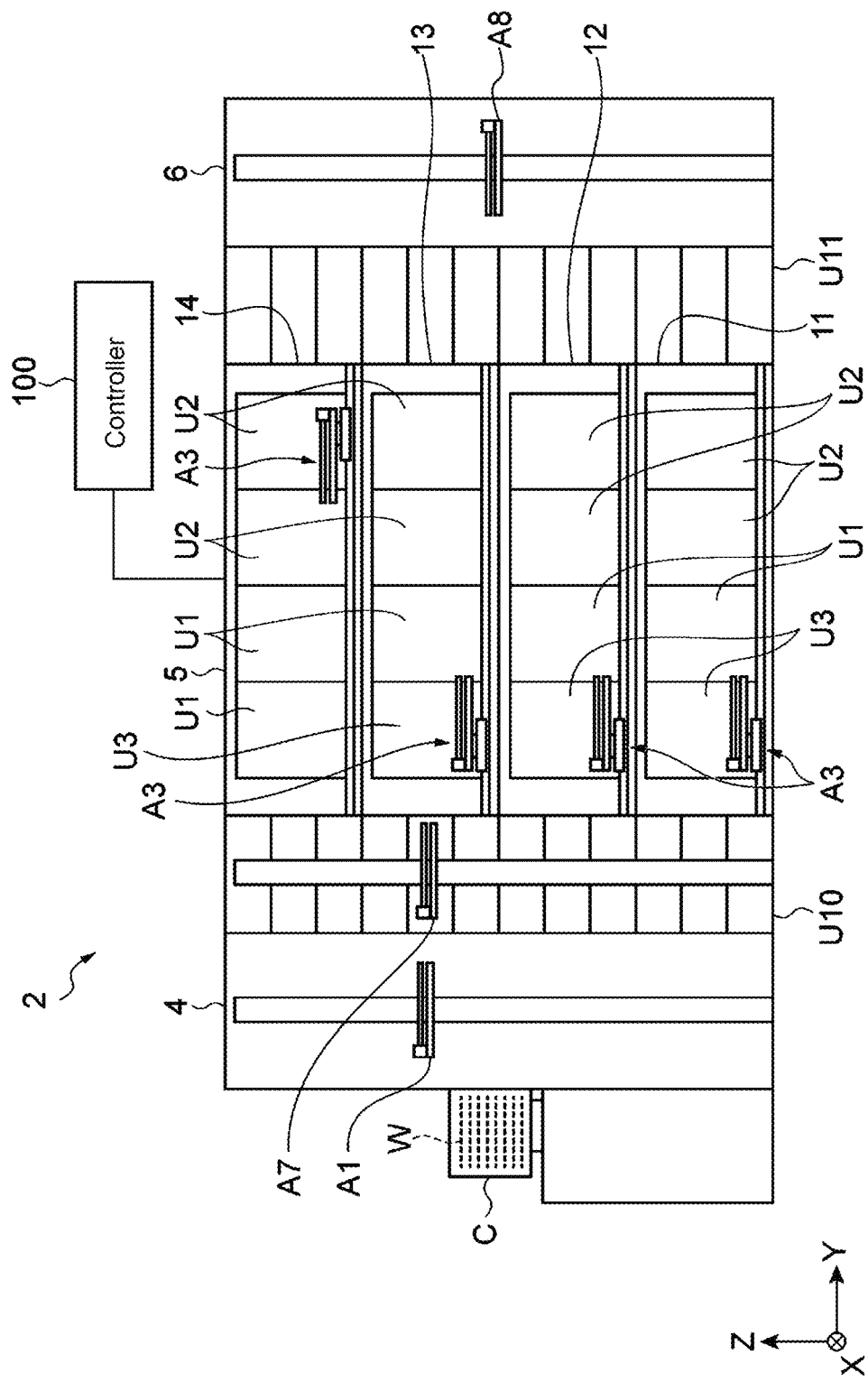
FIG. 2 is a schematic view illustrating an example of a coating/developing apparatus.

Hereinafter, a configuration of the coating/developing apparatus 2 will be described as an example of a substrate processing apparatus. As illustrated in FIGS. 1 and 2, the coating/developing apparatus 2 includes a carrier block 4, a processing block 5, an interface block 6, and a controller (control part) 100. The coating/developing apparatus 2 as the substrate processing apparatus described in an embodiment of the present disclosure corresponds to a shape characteristic value estimation apparatus that estimates a shape characteristic value related to a shape of a target film formed on a substrate. The term "shape characteristic value" related to the shape of the target film in the present embodiment represents a feature quantity related to the shape of the target film. As one example, the shape characteristic value may include a critical dimension (CD) such as a film thickness, a line width, or a hole diameter of the target film. In the following embodiment, a case where the coating/developing apparatus 2 as the shape characteristic value estimation apparatus estimates a film thickness of the target film will be described. A function of estimating a film thickness by the coating/developing apparatus 2 will be described later.

The carrier block 4 loads the wafer W into the coating/developing apparatus 2 and unloads the wafer W from the coating/developing apparatus 2. For example, the carrier block 4 is capable of supporting a plurality of carriers C (accommodation parts) for the wafer W and is provided with a transfer device A1 including a delivery arm built therein. The carrier C accommodates, for example, a plurality of circular wafers W. The transfer device A1 takes out the wafer W from the carrier C and delivers the wafer W to the processing block 5. The transfer device A1 receives the wafer W from the processing block 5 and returns the wafer W into the carrier C. The processing block 5 includes a plurality of processing modules 11, 12, 13 and 14.

The processing module 11 includes a plurality of coating units U1, a plurality of heat treatment units U2, a plurality of inspection units U3, and a transfer device A3 that transfers the wafer W to these units. The processing module 11 forms a lower layer film on the surface of the wafer W using the coating unit U1 and the heat treatment unit U2. For example, the coating unit U1 of the processing module 11 coats a processing liquid for formation of the lower layer film on the wafer W while rotating the wafer W at a predetermined number of rotations. The heat treatment unit U2 of the processing module 11 performs various heat treatments associated with the formation of the lower layer film. The heat treatment unit U2 includes, for example, a heating plate and a cooling plate built therein. The heat treatment unit U2 performs a heat treatment by heating the wafer W with the heating plate to a predetermined heating temperature and cooling the heated wafer W with the cooling plate. The inspection unit U3 performs a process for inspecting the surface state of the wafer W, and acquires, for example, information about a surface image or a shape characteristic value (film thickness) as information indicating the surface state of the wafer W.

The processing module 12 includes a plurality of coating units U1, a plurality of heat treatment units U2, a plurality of inspection units U3, and a transfer device A3 for transferring the wafer W to these units. The processing module 12 forms an intermediate film on the lower layer film by the coating unit U1 and the heat treatment unit U2. The coating unit U1 of the processing module 12 coats a processing liquid for forming the intermediate film onto the lower layer film to form a coating film on the surface of the wafer W. The heat treatment unit U2 of the processing module 12 performs various heat treatments associated with the formation of the intermediate film. The heat treatment unit U2 includes, for example, a heating plate and a cooling plate, and performs heat treatment by heating the wafer W to a predetermined heating temperature by the heating plate and cooling the heated wafer W by the cooling plate. The inspection unit U3 performs a process for inspecting the state of the surface of the wafer W, and acquires, for example, information related to a surface image or a shape characteristic value (film thickness), as information indicating the state of the surface of the wafer W.

The processing module 13 includes a plurality of coating units U1, a plurality of heat treatment units U2, a plurality of inspection units U3, and a transfer device A3 for transferring the wafer W to these units. The processing module 13 forms a resist film on the intermediate film by the coating unit U1 and the heat treatment unit U2. The coating unit U1 of the processing module 13 coats a processing liquid for forming the resist film onto the intermediate film, for example, while rotating the wafer W at a predetermined number of rotations. The heat treatment unit U2 of the processing module 13 performs various heat treatments associated with the formation of the resist film. The heat treatment unit U2 of the processing module 13 performs heat treatment (post applied bake: PAB) on the wafer W on which the coating film is formed at a predetermined heating temperature to form the resist film. The inspection unit U3 performs a process for inspecting the state of the surface of the wafer W and acquires, for example, information related to a shape characteristic value (film thickness), as information indicating the state of the surface of the wafer W.

The processing module 14 includes a plurality of coating units U1, a plurality of heat treatment units U2, and a transfer device A3 that transfers the wafer W to these units. The processing module 14 develops the exposed resist film using the coating unit U1 and the heat treatment unit U2. The coating unit U1 of the processing module 14 develops the resist film, for example, by applying a developing liquid onto the surface of the exposed wafer W while rotating the wafer W at a predetermined number of rotations, and then rinsing the wafer W with a rinsing liquid. The heat treatment unit U2 of the processing module 14 performs various heat treatments associated with the developing process. Specific examples of the heat treatment may include a heat treatment before the developing process (PEB: Post Exposure Bake), a heat treatment after the developing process (PB: Post Bake), and the like.

A shelf unit U10 is provided in the processing block 5 on the side of the carrier block 4. The shelf unit U10 is divided into a plurality of cells arranged in a vertical direction. A transfer device A7 including a lifting arm is provided near the shelf unit U10. The transfer device A7 moves the wafer W up and down between the cells of the shelf unit U10.

A shelf unit U11 is provided in the processing block 5 on the side of the interface block 6. The shelf unit U11 is divided into a plurality of cells arranged in the vertical direction.

The interface block 6 delivers the wafer W to and from the exposure apparatus 3. For example, the interface block 6 is provided with a transfer device A8 including a delivery arm built therein and is connected to the exposure apparatus 3. The transfer device A8 transfers the wafer W disposed on the shelf unit U11 to the exposure apparatus 3, receives the wafer W from the exposure apparatus 3, and returns the wafer W to the shelf unit U11.

[Inspection Unit]

The inspection unit U3 included in each of the processing modules 11 to 13 will be described. The inspection unit U3 has a function of capturing the surfaces of the films (for example, the lower layer film, the intermediate film, the resist film and the like) formed by the coating unit U1 and the heat treatment unit U2, and obtaining image data.

Figure 3:
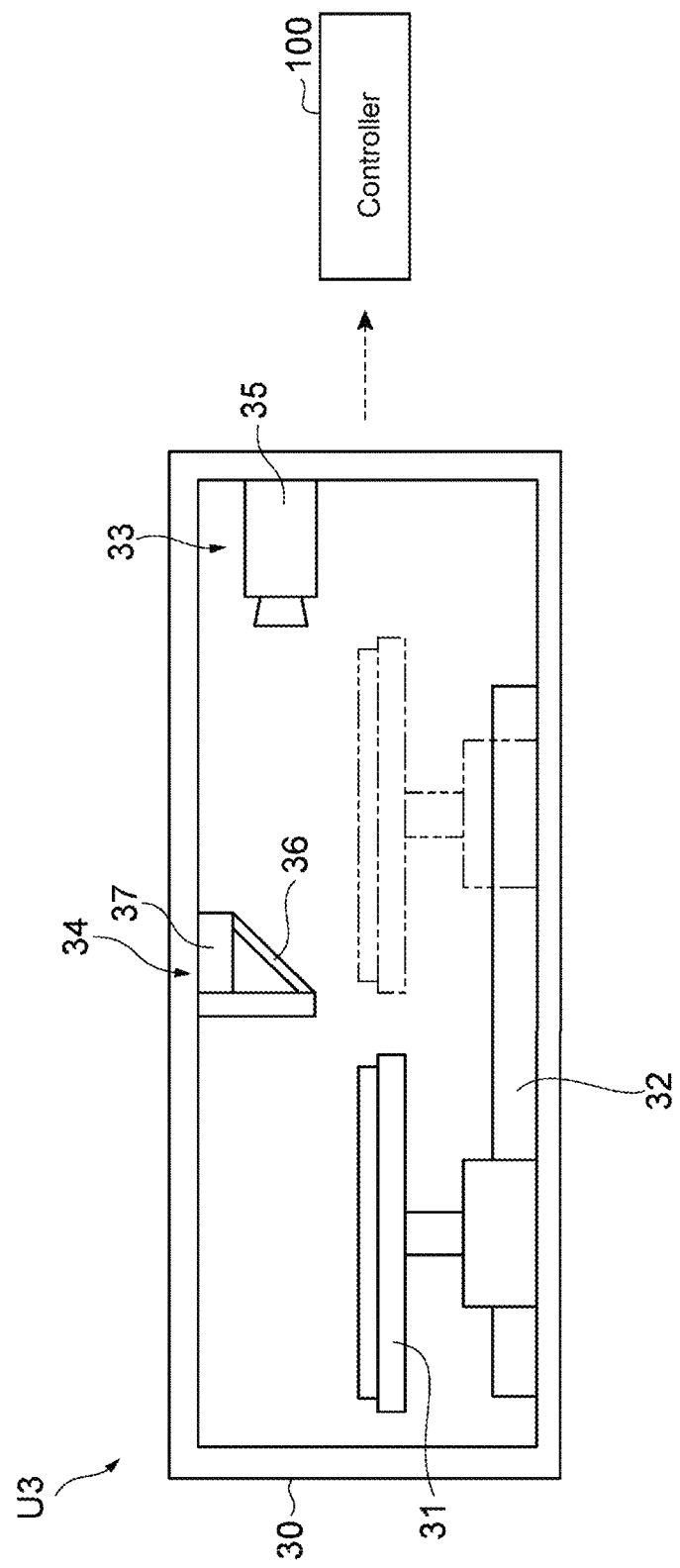
FIG. 3 is a schematic view illustrating an example of an inspection unit.

As shown in FIG. 3, the inspection unit U3 includes a housing 30, a holder 31, a linear driving part 32, a capturing part 33, and a transmitting/reflecting part 34. The holder 31 holds the wafer W horizontally. The linear driving part 32 uses, for example, an electric motor as a power source, and moves the holder 31 along a horizontal linear path. The capturing part 33 has a camera 35 such as a CCD camera or the like. The camera 35 is provided on one end side in the inspection unit U3 in the movement direction of the holder 31 and is oriented to the other end side in the movement direction. The transmitting/reflecting part 34 transmits light over a capturing range and guides a reflected light reflected in the capturing range toward the camera 35. For example, the transmitting/reflecting part 34 has a half mirror 36 and a light source 37. The half mirror 36 is provided at a position higher than the holder 31 in the middle portion of the movement range of the linear driving part 32, and is configured to reflect light from below toward the camera 35. The light source 37 is provided above the half mirror 36, and is configured to irradiate illumination light downward through the half mirror 36.

The inspection unit U3 operates as follows to acquire image data of the surface of the wafer W. First, the linear driving part 32 moves the holder 31. Thus, the wafer W passes under the half mirror 36. In this passing process, the reflected light from each portion of the surface of the wafer W is sequentially sent to the camera 35. The camera 35 focuses an image using the reflected light from each portion of the surface of the wafer W, and acquires the image data of the surface of the wafer W. When a shape (for example, film thickness, line width or the like) of the film formed on the surface of the wafer W is changed, for example, the color of the surface of the wafer W is changed according to the shape change, whereby the image data of the surface of the wafer W obtained by the camera 35 is changed. That is, the acquisition of the image data of the surface of the wafer W is equivalent to the acquisition of information about the shape of the film formed on the surface of the wafer W. On this point, a description will be made later.

The image data acquired by the camera 35 is sent to the controller 100. The controller 100 may estimate a shape characteristic value of the film on the surface of the wafer W based on the image data. The estimation result is held as an inspection result in the controller 100. The image data is also held in the controller 100.

[Controller]

An example of the controller 100 will be described in detail. The controller 100 controls respective elements included in the coating/developing apparatus 2. The controller 100 is configured to perform a process processing including forming each film described above on the surface of the wafer W and performing a development process. Furthermore, the controller 100 is a main part of the shape characteristic value estimation apparatus and is configured to perform a process of estimating a shape characteristic value of the formed film. In the present disclosure, a configuration example of the controller 100 in the case of estimating the film thickness of the target film as the shape characteristic value in the coating/developing apparatus 2 will be described.

Figure 4:
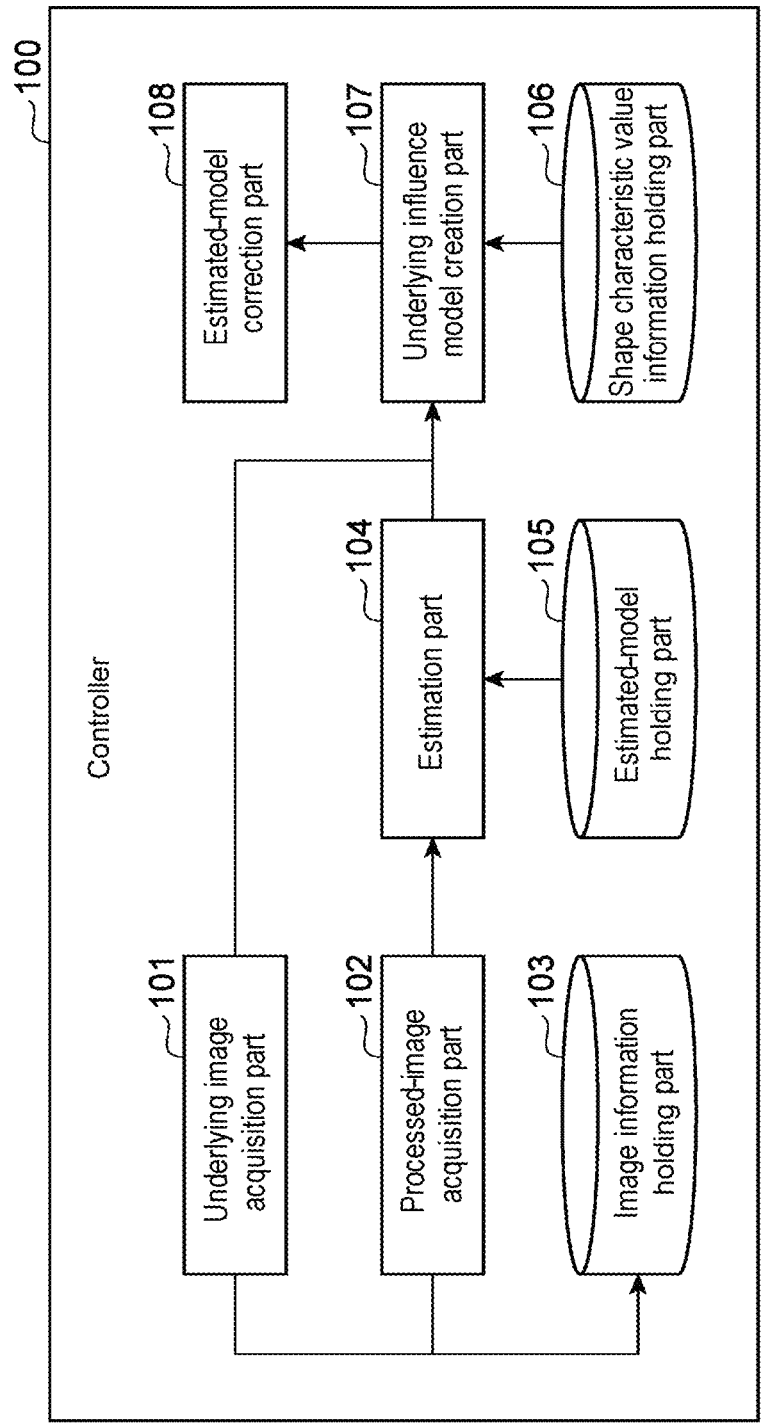
FIG. 4 is a block diagram illustrating an example of a functional configuration of a controller.

As illustrated in FIG. 4, the controller 100 has an underlying image acquisition part 101, a processed-image acquisition part 102, an image information holding part 103, an estimation part 104, an estimated-model holding part 105, and a shape characteristic value information holding part 106 as functional components. In addition, the controller 100 has an underlying influence model creation part 107 and an estimated-result correction part 108. Each functional part illustrated in FIG. 4 is a functional part for realizing a function as a film thickness estimation apparatus as a kind of shape characteristic value estimation apparatus.

Before describing each functional part, an outline of a process (inspection) performed by the coating/developing apparatus 2 including the controller 100 as an apparatus for inspecting a substrate (shape characteristic value estimation apparatus) will be described. The coating/developing apparatus 2 performs a process of estimating a film thickness of a film formed on a surface of a wafer W from an image obtained by capturing the surface of the wafer W. When a film is formed on the surface of the wafer W, the color of the surface changes depending on a thickness thereof. Using this, the coating/developing apparatus 2 estimates a film thickness at each point on the surface of the wafer W from the image data including information related to the color of the surface of the wafer W.

As one example, a procedure for estimating a film thickness is as follows. That is, first, a plural sheets of wafers for which the film thickness of a film to be estimated (target film) is known are prepared. Then, a film thickness estimation model (shape characteristic value estimation model) associated with a correlation between information related to the color of each pixel in image information obtained by capturing the surfaces of the wafers and a film thickness of the film on the surface of the wafer at a position captured by the pixel is created. Thereafter, an image obtained by capturing the surface of the wafer on which the target film for which the film thickness is to be estimated is formed is acquired, and the film thickness of the film on the surface of the wafer is estimated based on the information related to the color of each pixel included in the image data and the film thickness estimation model. This makes it possible to estimate the film thickness of the target film on the surface of the wafer.

Figure 5:
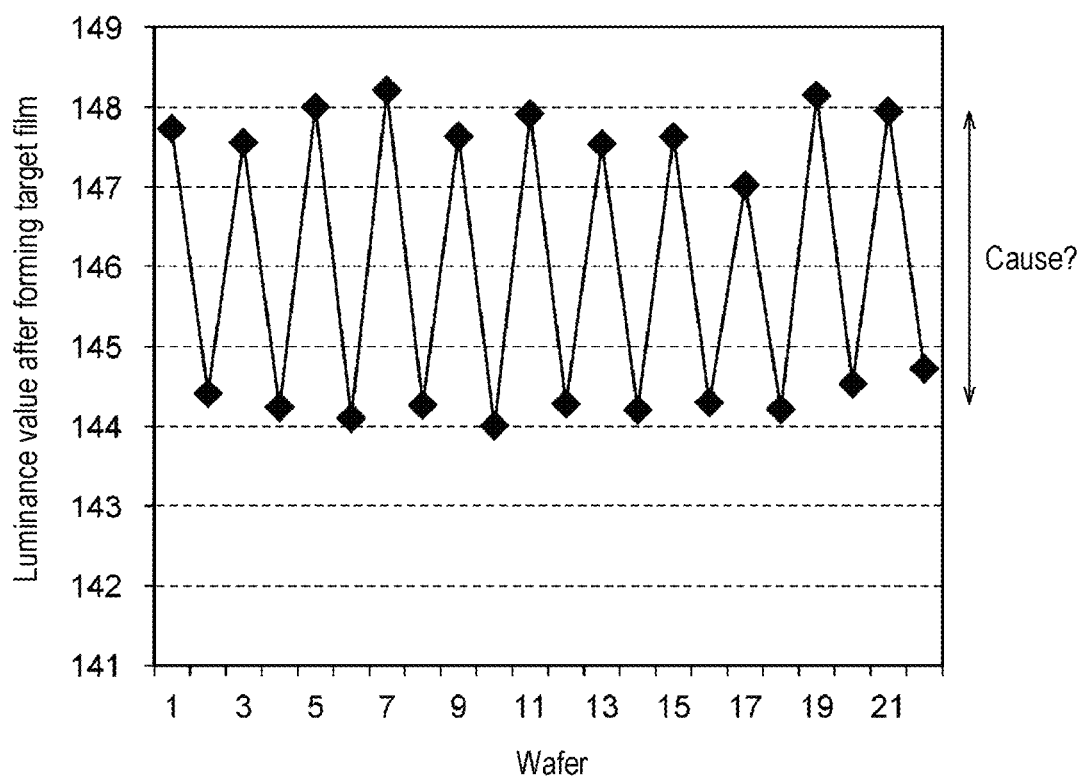
FIG. 5 is a view schematically illustrating a change in information related to colors acquired from image data obtained by capturing plural sheets of wafers.
Figure 6:
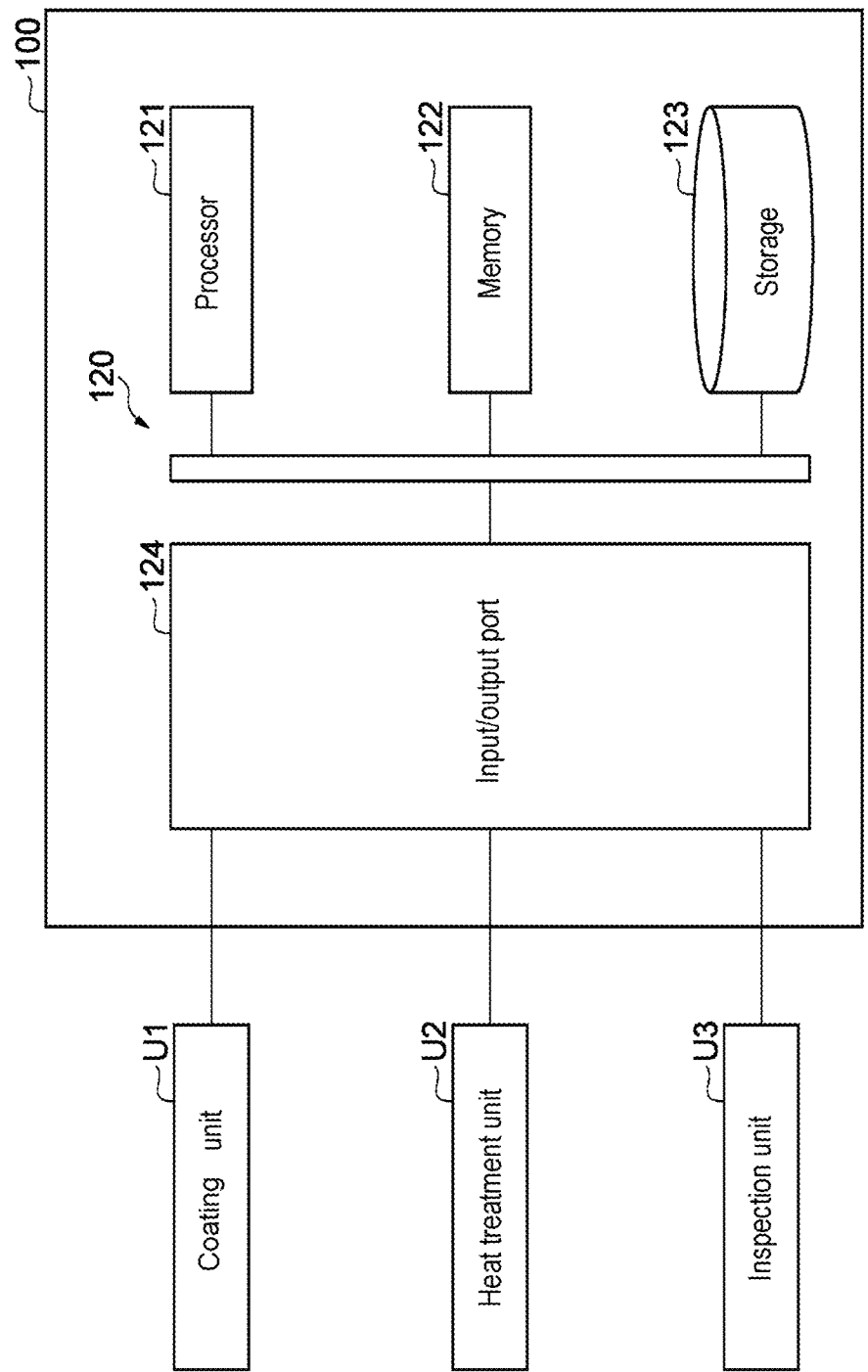
FIG. 6 is a block diagram illustrating an example of a hardware configuration of the controller.

FIG. 5 schematically illustrates a change in information related to a color acquired from the image data obtained by capturing the plural sheets of wafers. The information related to the color of the surface (here, a gray value), acquired from the image data obtained by capturing the surface of the wafer after the target film is formed, is indicated in FIG. 5. As illustrated in FIG. 5, since a different color is indicated for each wafer, the film thickness of the film on the surface of the wafer is estimated by using the difference in colors.

However, in the aforementioned method, there is a possibility that the film thickness estimation model that takes into consideration a state of an underlayer of the film for which the film thickness is to be estimated has not been created. As described above, a plurality of films are formed on the wafer. Therefore, if the target film for which the film thickness is to be estimated is a resist film, a lower layer film and an intermediate film are laminated under the resist film. Thus, the difference in the colors of the wafer surface for each wafer as illustrated in FIG. 5 is not a change derived from the film thickness of the target film for which the film thickness is to be estimated, but there is also a possibility that a variation in a state of an underlying portion below the respective film (i.e., in a state in which the processing of the target film is not performed) is reflected. When the film thickness of the film formed on the surface is sufficiently thin like the target substrate in the present embodiment, it is fully considered that the variation in the state of the underlying portion will be reflected in the variation in the color of the surface of the wafer.

The film thickness estimation model described above estimates a correlation between the film thickness of the resist film and the color information in the image data, but it can be said that it does not consider a case where the film thickness of each film under the resist film is different. For example, if the film thickness of the intermediate film under the resist film changes, there is a possibility that the color of the wafer surface may change depending on the film thickness of the intermediate film even before the resist film is coated. However, the film thickness estimation model may not sufficiently reflect the influence of such underlying film. In consideration of the aforementioned problems, there may be proposed one scheme that the film thickness estimation model is created using a wafer in which the state (film thickness or the like) of the underlying film is changed. However, it may be considered that it is difficult to prepare a considerable number of wafers that meet various conditions necessary to create a model with high estimation accuracy.

Therefore, the coating/developing apparatus 2 described in the present embodiment creates a model to estimate how much the difference in the underlying portion influences the estimation result of the film thickness using the image information (underlying image) obtained by capturing the surface of the underlying portion below the target film (in a state in which the target film is not formed). Specifically, for the wafer on which the target film is formed, the model is created from the estimation result (estimated value) of the film thickness using the film thickness estimation model, a film thickness value obtained by a method that does not use the film thickness estimation model, and the image information (underlying image) of the surface of the wafer before the target film is applied. This model (underlying influence model) is a model that estimates how much the underlying portion influences the estimation result of the film thickness of the target film by the film thickness estimation model from the image data of the underlying portion. The coating/developing apparatus 2 described in the present embodiment implements obtaining a more accurate film thickness estimation result by removing an error in the estimated film thickness caused by the variation in the film thickness of the underlying portion using the underlying influence model.

The controller 100 performs such a process of estimating the film thickness with high accuracy.

The underlying image acquisition part 101 of the controller 100 illustrated in FIG. 4 has a function of acquiring image information (underlying image) of the surface of the wafer on which the target film for which the film thickness is to be estimated is formed, before forming the target film. The underlying image acquisition part 101 acquires an image of the underlying portion of the target wafer W by controlling, for example, the inspection unit U3.

The processed-image acquisition part 102 has a function of acquiring image information (processed image) of the surface of the wafer W after forming the target film. The processed-image acquisition part 102 acquires the processed image of the target wafer W by controlling, for example, the inspection unit U3.

The image information holding part 103 has a function of holding the underlying image acquired by the underlying image acquisition part 101 and the processed image acquired by the processed-image acquisition part 102. The image information held in the image information holding part 103 is used for estimating the film thickness of the target film formed on the wafer W.

The estimation part 104 has a function of estimating the film thickness of the target film based on the processed image held in the image information holding part 103. The film thickness estimation model is used in estimating the film thickness by the estimation part 104.

The estimated-model holding part 105 has a function of holding the film thickness estimation model used for estimating the film thickness by the estimation part 104. The film thickness estimation model is a model for calculating the film thickness from the information related to the color of each pixel (the change in the color before and after forming a predetermined film) in the image data obtained by capturing the surface of the wafer W when the predetermined film is formed, and is a model indicating a corresponding relationship between the information related to the color and the film thickness. By preparing such a model in advance, holding the same in the estimated-model holding part 105, and acquiring the information related to the color of the wafer surface at each position of the image data, the film thickness can be estimated from the information related to the color. The method of creating the film thickness estimation model is not particularly limited, but may be created by using a known statistical processing method or the like. For example, information related to a change in the color of the substrate surface due to the formation of the film is acquired from the information related to the color of the surface of a underlying substrate included in the underlying image acquired by the underlying image acquisition part 101 and the information related to the color of the surface of the processed substrate included in the processed image acquired by the processed-image acquisition part 102. Thereafter, the film thickness estimation model can be created by calculating the correlation between the color change and the film thickness. However, the aforementioned method is merely an example, and is not limited to the aforementioned example. For example, the model may be created by calculating the correlation between the color change and the film thickness using only the information related to the color of the surface of the processed substrate without using the information related to the color of the surface of the underlying substrate. Alternatively, the film thickness estimation model may be created by the coating/developing apparatus 2, or may be created by, for example, another apparatus.

The shape characteristic value information holding part 106 has a function of holding the information related to the thickness of the target film (sometimes referred to as a film thickness value: film thickness information), which corresponds to the shape characteristic value related to the target film acquired without using the film thickness estimation model. For example, a measured value of the film thickness of the target film measured by any method may be used as the film thickness value of the target film acquired without using the film thickness estimation model. Furthermore, in a state in which the operation of the coating/developing apparatus 2 is stable, since a substrate for inspection is evaluated by performing, for example, film formation during detailed inspection (QC inspection) related to the operation confirmation of the apparatus, the inspection result obtained at this time may be used as the film thickness value (film thickness information). In addition, if the characteristics of each of the plurality of units (the coating units, the heat treatment units, and the like) related to the film formation included in the coating/developing apparatus 2 can be recognized to some extent, it may be configured that the film thickness value is obtained based on which unit is used for processing. Furthermore, if it is recognized in advance from the apparatus characteristics that the film thickness after the film formation gradually changes, the film thickness value may be a value obtained by adding a time-dependent estimated value to the measured value periodically measured. The film thickness value used as the film thickness information may be a value of high reliability to some extent and may be a value acquired (or calculated) without using the film thickness estimation model and may be acquired by using various methods. The film thickness value held in the shape characteristic value information holding part 106 may be configured to be acquired while performing a film-forming process on the wafer W as in the case of actually measuring the value by any method. Further, the film thickness value may be configured to be acquired (calculated) in advance when using the estimated value or the like as the film thickness value. In some embodiments, the film thickness value may be set to one value for each wafer W. For example, a plurality of film thickness values (for example, for each shot or die) may be defined for one wafer W.

The underlying influence model creation part 107 has a function of creating a underlying influence model based on the estimation result (estimated value) of the film thickness using the film thickness estimation model, the film thickness value obtained by the method that does not use the film thickness estimation model, and the image information (underlying image) of the surface of the wafer before coating the target film. The underlying influence model is created after the estimation results by the film thickness estimation model are accumulated to some extent. Details of the underlying influence model will be described later.

The estimated-result correction part 108 has a function of correcting the film thickness value estimated by the film thickness estimation model based on the underlying influence model created by the underlying influence model creation part 107. Since it is possible to estimate whether the underlying portion influences the estimation result of the film thickness using the underlying influence model, it is possible to obtain a more accurate film thickness estimation result by removing the component of the influence of the underlying portion from the film thickness value estimated by the film thickness estimation model.

The controller 100 is composed of one or more control computers. For example, the controller 100 includes a circuit 120 shown in FIG. 5. The circuit 120 includes one or more processors 121, a memory 122, a storage 123, and an input/output port 124. The storage 123 includes a non-transitory computer-readable storage medium such as a hard disk or the like. The storage medium stores a program for causing the controller 100 to execute a substrate inspection procedure described later. The storage medium may be a removable medium such as a non-volatile semiconductor memory, a magnetic disk, or an optical disk. The memory 122 temporarily stores the program loaded from the storage medium of the storage 123 and the calculation result obtained by the processor 121. The processor 121 constitutes each functional module described above by executing the above program in cooperation with the memory 122. The input/output port 124 inputs and outputs an electric signal to and from a control target member according to a command from the processor 121.

The hardware configuration of the controller 100 is not necessarily limited to the one in which each functional module is constituted by the program. For example, each functional module of the controller 100 may be constituted by a dedicated logic circuit or an ASIC (Application Specific Integrated Circuit) in which the dedicated logic circuit is integrated.

Furthermore, in the following embodiment, a case where the aforementioned configuration is included in the controller 100 will be described, but all the aforementioned functions may not be included in the controller 100. For example, the functional part as a database, such as the image information holding part 103, the estimated-model holding part 105, and the shape characteristic value information holding part 106 or the like, may be configured to be installed in an external device.

[Process Procedure]

Next, a process procedure executed in the coating/developing apparatus 2 will be described as an example of a coating/developing process.

In the process procedure, first, the controller 100 controls the transfer device A1 so as to transfer a target wafer W in the carrier C to the shelf unit U10, and controls the transfer device A7 so as to arrange the wafer W in the cell for the processing module 11.

Subsequently, the controller 100 controls the transfer device A3 so as to transfer the wafer W of the shelf unit U10 to the coating unit U1 and the heat treatment unit U2 in the processing module 11. Furthermore, the controller 100 controls the coating unit U1 and the heat treatment unit U2 so as to form a lower layer film on the surface of the wafer W. Thereafter, the controller 100 controls the transfer device A3 so as to return the wafer W on which the lower layer film is formed to the shelf unit U10, and controls the transfer device A7 so as to arrange the wafer W in the cell for the processing module 12.

Subsequently, the controller 100 controls the transfer device A3 so as to transfer the wafer W of the shelf unit U10 to the coating unit U1 and the heat treatment unit U2 in the processing module 12. Furthermore, the controller 100 controls the coating unit U1 and the heat treatment unit U2 so as to form an intermediate film on the lower layer film of the wafer W. For example, the controller 100 controls the coating unit U1 so as to form the intermediate film by coating a processing liquid for forming the intermediate film onto the lower layer film of the wafer W. Subsequently, the controller 100 controls the heat treatment unit U2 so as to perform heat treatment on the intermediate film. After forming the intermediate film, the controller 100 controls the transfer device A3 so as to transfer the wafer W to the inspection unit U3, and controls the inspection unit U3 so as to acquire image information (underlying image) by capturing the surface of the wafer W. Thereafter, the controller 100 controls the transfer device A3 so as to return the wafer W to the shelf unit U10, and controls the transfer device A7 so as to arrange the wafer W in the cell for the processing module 13.

Subsequently, the controller 100 controls the transfer device A3 so as to transfer the wafer W of the shelf unit U10 to each unit in the processing module 13, and controls the coating unit U1 and the heat treatment unit U2 so as to form a resist film on the intermediate film of the wafer W. For example, the controller 100 controls the coating unit U1 so as to form the resist film by coating a processing liquid for forming the resist film onto the intermediate film of the wafer W. Subsequently, the controller 100 controls the heat treatment unit U2 so as to perform heat treatment on the resist film. In addition, after forming the resist film, the controller 100 controls the transfer device A3 so as to transfer the wafer W to the inspection unit U3, and controls the inspection unit U3 so as to acquire image information (processed image) by capturing the surface of the wafer W. Thereafter, the controller 100 controls the transfer device A3 so as to transfer the wafer W to the shelf unit U11.

Subsequently, the controller 100 controls the transfer device A8 so as to send the wafer W of the shelf unit U11 to the exposure apparatus 3. Thereafter, the controller 100 controls the transfer device A8 so as to receive the wafer W, which has been subjected to the exposure process, from the exposure apparatus 3, and arrange the wafer W in the cell for the processing module 14 in the shelf unit U11.

Subsequently, the controller 100 controls the transfer device A3 so as to transfer the wafer W of the shelf unit U11 to each unit in the processing module 14, and controls the coating unit U1 and the heat treatment unit U2 so as to perform a development process on the resist film R of the wafer W. Thereafter, the controller 100 controls the transfer device A3 so as to return the wafer W to the shelf unit U10, and controls the transfer device A7 and the transfer device A1 so as to return the wafer W into the carrier C. Consequently, the process processing is completed.

[Film Thickness Estimation Method]

Next, a film thickness estimation method in the processing modules 11 to 13 by the controller 100 will be described with reference to FIGS. 7 to 10. The film thickness estimation method is a method related to the inspection of the wafer W after film formation, which is performed in the inspection units U3 provided in the processing modules 11 to 13. The inspection unit U3 evaluates whether a desired film has been formed on the wafer W after the film formation, particularly, whether a film having a desired film thickness has been formed by estimating the film thickness.

In the following embodiment, a case of estimating a film thickness of a resist film will be described. Therefore, the target film is the resist film, and a wafer W before forming the resist film (i.e., a wafer on which up to an intermediate film is formed) will be described as an underlying substrate. However, the target film is not limited to the resist film. For example, the film thickness of the intermediate film may be estimated by using the target film as the intermediate film. In that case, the underlying substrate becomes a wafer before the intermediate film is formed, i.e., a wafer on which the underlying film is formed. In this manner, the setting of the underlying substrate may be changed according to the target film for which the film thickness is to be estimated. Furthermore, the underlying substrate may be a substrate which has been subjected to any process (for example, film formation, etching, cleaning, or the like) by another apparatus.

As described above, the underlying substrate may be a substrate before forming the target film, and is not particularly limited.

Figure 7:
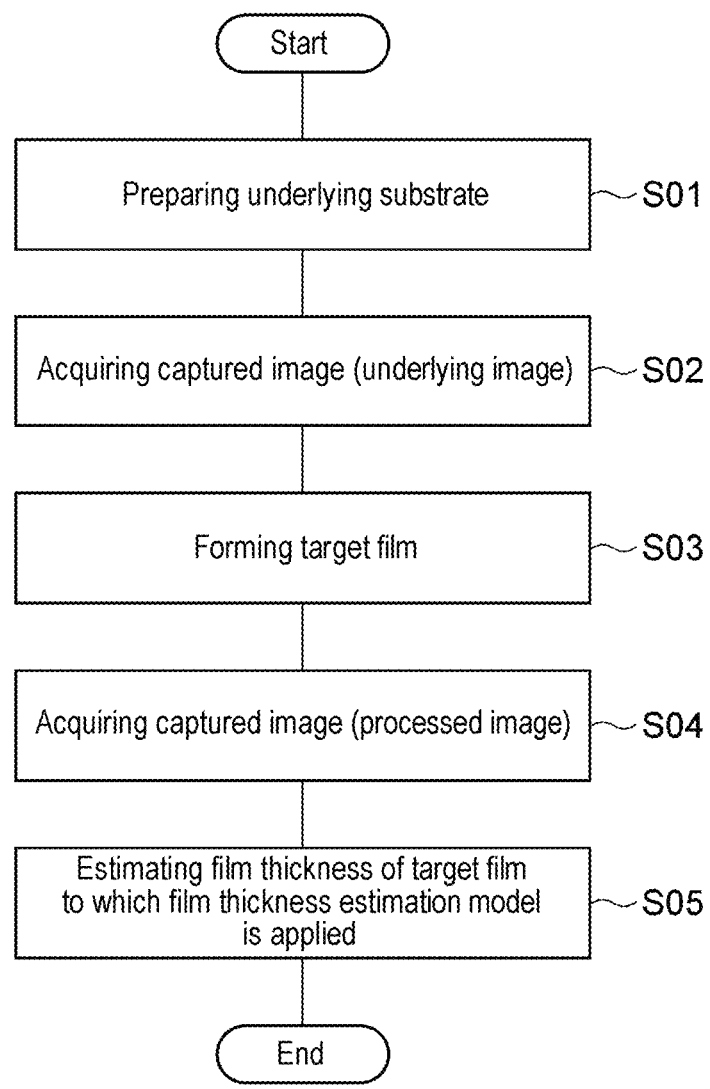
FIG. 7 is a flowchart illustrating an example of a film thickness estimation method.

FIG. 7 is a flowchart illustrating a procedure up to film thickness estimation to which the film thickness estimation model is applied in a series of flows of the film thickness estimation method. First, the controller 100 executes step S01. In step S01, an underlying substrate is prepared and loaded into the inspection unit U3. The underlying substrate is a wafer W on which up to the intermediate film has been formed in the coating unit U1 and the heat treatment unit U2 as described above. The loaded underlying substrate is held by the holder 31.

Subsequently, the underlying image acquisition part 101 of the controller 100 executes step S02. In step S02, the surface of the underlying substrate is captured by the capturing part 33. Specifically, the surface of the underlying substrate is captured by the capturing part 33 while the holder 31 is moved in a predetermined direction by the driving of the linear driving part 32. Thus, image information (underlying image) related to the surface of the underlying substrate is acquired by the capturing part 33. The underlying image is held in the image information holding part 103 of the controller 100.

Subsequently, the controller 100 executes step S03. In step S03, a resist film, which is the target film, is formed on the underlying substrate. The wafer W on which film formation is performed in the coating unit U1 and the heat treatment unit U2 is loaded into the inspection unit U3. The loaded wafer W after the film formation is held by the holder 31.

Subsequently, the processed-image acquisition part 102 of the controller 100 executes step S04. In step S04, the surface of the processed wafer W is captured by the capturing part 33 in the same manner as in step S02. Specifically, the surface of the processed wafer W is captured by the capturing part 33 while the holder 31 is moved in a predetermined direction by the driving of the linear driving part 32. Thus, image information (processed image) related to the surface of the wafer W is acquired by the capturing part 33. The processed image is held in the image information holding part 103 of the controller 100.

Subsequently, the estimation part 104 of the controller 100 executes step S05. In step S05, the film thickness of the target film on the surface of the wafer W is estimated based on the processed image of the surface of the wafer W. The film thickness estimation model held in the estimated-model holding part 105 is used for the film thickness estimation by the estimation part 104.

Specifically, a method of estimating the film thickness from the processed image is as follows. First, information related to a color of the surface of the wafer W for each pixel is acquired from the processed image. At this time, a process of calculating a correlation with the underlying image before film formation may be performed. Whether or not this procedure is performed may be appropriately changed depending on a condition under which the film thickness estimation model is applied. Thereafter, a comparison with the film thickness model held in the estimated-model holding part 105 is made. Thus, a film thickness of a region captured by the pixel can be estimated for each pixel. This makes it possible to estimate a film thickness of the target film for each pixel, i.e., at each position on the surface of the wafer W. The series of processes up to this point is a method generally used for the film thickness estimation using the film thickness estimation model.

Subsequently, in the film thickness estimation method described in the present embodiment, correction is performed using an underlying influence model illustrated in FIG. 8.

Figure 8:
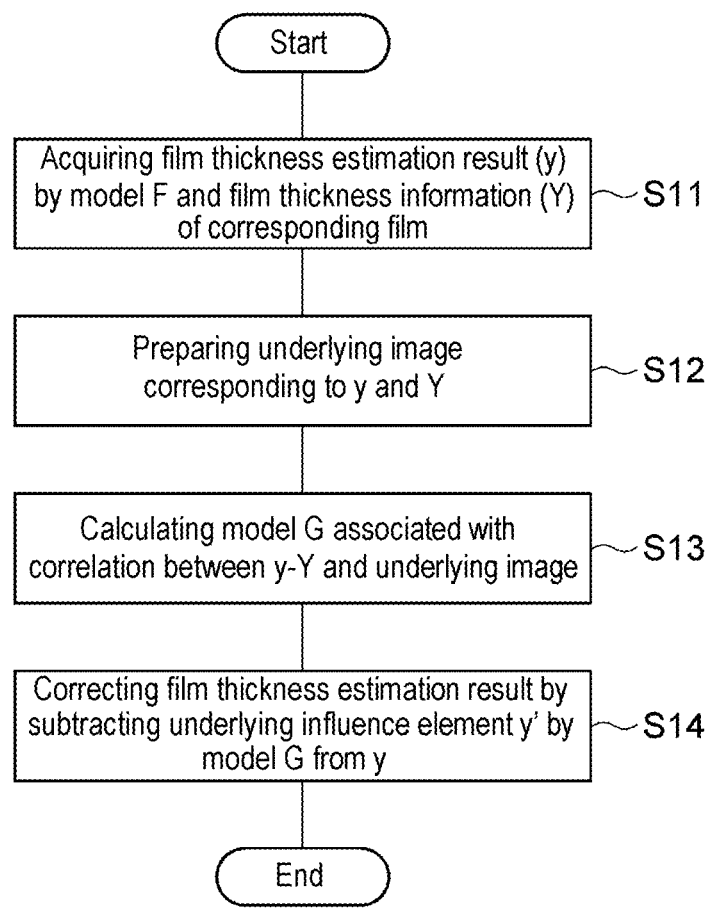
FIG. 8 is a flowchart illustrating an example of a film thickness estimation method.

As illustrated in FIG. 8, the underlying influence model creation part 107 of the controller 100 sequentially executes steps S11 to S13 associated with the creation of the underlying influence model. In step S11, first, a film thickness estimation result y of a corresponding film by a film thickness estimation model F at a specific pixel and film thickness information Y of the corresponding film are acquired. In step S12, an underlying image related to the wafer W for which the film thickness is to be estimated is prepared. Then, in step S13, an underlying influence model G associated with a correlation between a difference between the film thickness estimation result y and the film thickness information Y and color information included in the underlying image is created. Then, after creating the underlying influence model G, the estimated-result correction part 108 of the controller 100 executes step S14. In step S14, the film thickness estimation result is corrected by subtracting an underlying influence element y' calculated from the underlying influence model G from the film thickness estimation result y of the corresponding film. Hereinafter, these steps will be described.

It is assumed that the film thickness estimation result by the film thickness estimation model in the processed image is y, and the film thickness information of the corresponding film is Y. Furthermore, it is assumed that the film thickness estimation model created based on the image after film formation (processed image) is F (processed image). Since the film thickness estimation result y is calculated from the film thickness estimation model, it should satisfy a relationship of the following equation (1).

$$y = F(\text{processed image}) \quad \text{Eq. (1)}$$

Where, if the accuracy of the film thickness estimation model is sufficiently high, the film thickness estimation result y should match the film thickness information Y. However, it is actually in a state of the following equation (2).

$$Y = F(\text{processed image}) + \text{error1} \quad \text{Eq. (2)}$$

Figure 9:
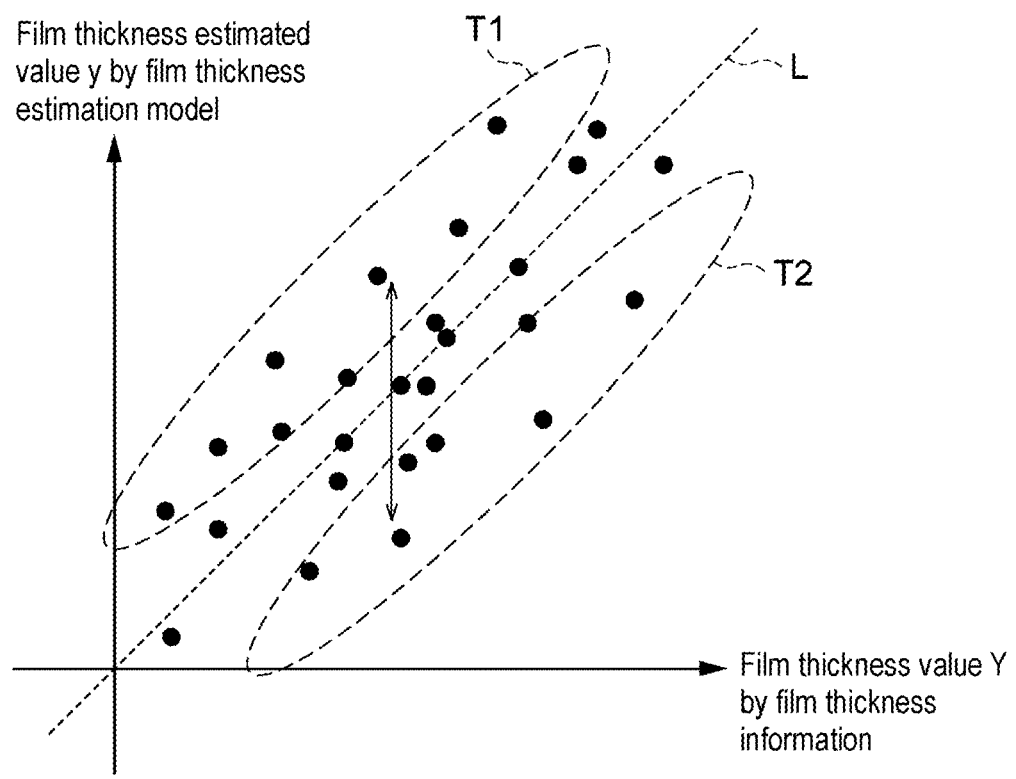
FIG. 9 is a schematic view illustrating an example of variation in estimation results by a film thickness estimation model.

FIG. 9 schematically illustrates a state in which the film thickness estimation result may include an error "error 1", as indicated in Eq. (2). In FIG. 9, the relationship between the film thickness estimation result y and the film thickness information Y at a specific pixel is plotted for each target wafer W. If the film thickness estimation result y and the film thickness information Y match, each point should be aligned on a straight line L (y=Y) illustrated in FIG. 9. However, actually, the film thickness estimation result y and the film thickness information Y do not match, and there exist a group T1 in which the film thickness estimation result y is larger than the film thickness information Y and a group T2 in which the film thickness estimation result y is smaller than the film thickness information Y. In addition to a simple error, an error caused by insufficient accuracy of the film thickness estimation model F may be included in the "error 1" in Eq. (2). As one of the causes of the deterioration of the accuracy of the film thickness estimation model F, it may be considered that a variation derived from the underlying substrate below the target film is not sufficiently removed as described above.

Therefore, a correlation between the color information obtained from the underlying image and a portion corresponding to the "error1" is recognized as the underlying influence model. Assuming that the underlying influence model is G, the underlying influence model becomes a model satisfying the following equation (3).

$$y - Y = G(\text{underlying image}) + \text{error2} \quad \text{Eq. (3)}$$

It may be considered that the variation derived from the underlying substrate is included in the "error1" in Eq. (2) as described above, but a component derived from the underlying substrate is handled as the underlying influence model G as described above. As a result, the component derived from the underlying substrate is removed from the "error 2" in Eq. (3), and only the so-called simple error is included therein.

Figure 10:
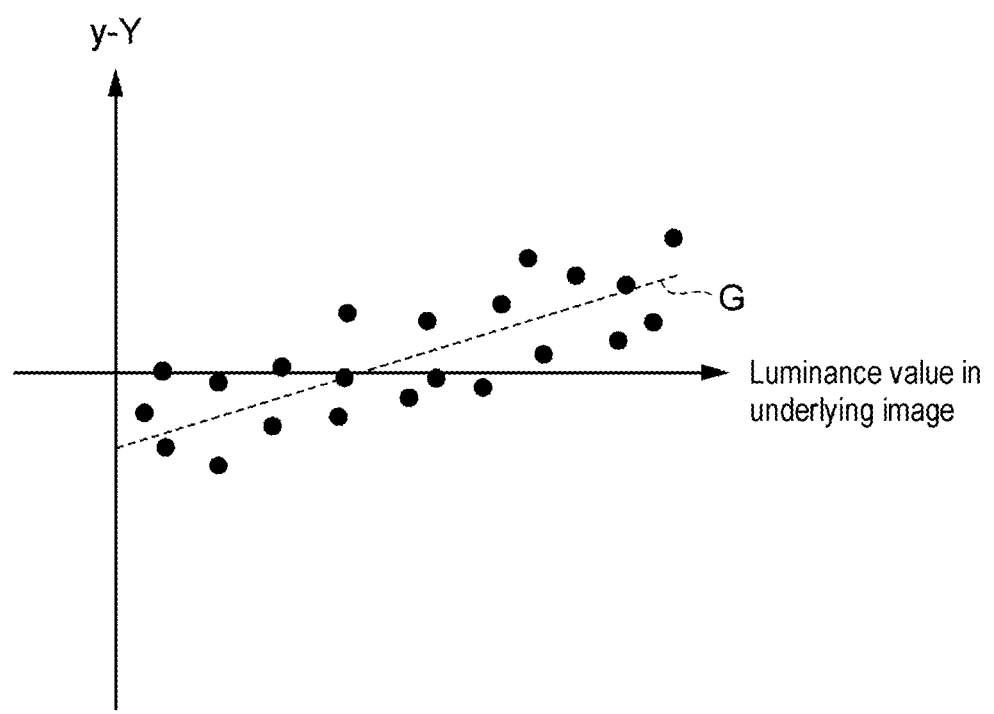
FIG. 10 is a schematic view illustrating an example of an underlying influence model.

FIG. 10 schematically illustrates the underlying influence model G. The underlying influence model G is, for example, a model indicating a correlation between the information related to the color of the surface of the underlying substrate in the underlying image (for example, a luminance value in the underlying image) and y−Y. As illustrated in FIG. 10, correction corresponding to the color of the surface of the underlying substrate can be added by modeling the correlation between the information related to the color of the surface of the underlying substrate (for example, the luminance value in the underlying image) and y−Y. That is, the variation (corresponding to y−Y) derived from the underlying substrate, which is considered to be included in the estimated value of the film thickness estimated using the film thickness estimation model F, can be recognized from the underlying influence model G.

Assuming that the underlying influence element obtained from the underlying influence model at a specific pixel is y', y' satisfies a relationship of the following equation (4).

$$y' = G(\text{underlying image}) \quad \text{Eq. (4)}$$

If the underlying influence element y' is subtracted from the film thickness estimation result y estimated using the film thickness estimation model F, the film thickness estimation result y can be approximated to the film thickness information Y, i.e., can be approximated to a more accurate value, as indicated in the following equation Eq. (5). As indicated in Eq. (5), error2 related to the simple error is included in the y−y'. However, since a model error is not included in the error 2 as described above, the model error that may be included in the estimation result can be removed from the y−y' only when the film thickness estimation model F is used.

$$y - y' = y - (y - Y) + \text{error2} = Y \cdot \text{error2} \quad \text{Eq. (5)}$$

Furthermore, a state in which the underlying influence model G becomes a linear function to the luminance value of the underlying image is illustrated in FIG. 10, but is a simpler example for description. As illustrated in FIG. 10, the underlying influence model G may be obtained as a linear function by using only one value as the information related to the color of the underlying image, but a more complex statistical method may be used to implement modeling with higher accuracy. That is, the model may be created by using, for example, multiple parameters such as RGB values and using a statistical method using their feature quantities, as well as using only the luminance value as the information related to the color of the underlying image when creating the underlying influence model G. The underlying influence model G may be created by using, for example, not only multiple regression analysis, non-linear analysis, decision tree analysis, but also a statistical method such as known regression analysis.

The creation of the underlying influence model G and the correction of the film thickness estimation result using the underlying influence model G (the series of processes illustrated in FIG. 8) described above may be performed in a state in which the estimation results of the film thickness of the target film using the film thickness estimation model F are accumulated to some extent. This is because it is not possible to recognize how much the film thickness estimation model F includes the variation derived from the underlying substrate (i.e., the component corresponding to the underlying influence model G) at a stage where the film thickness estimation model F is prepared. Therefore, after the film thickness is estimated for plural sheets of wafers W using the film thickness estimation model F, the creation of the underlying influence model G and the correction of the film thickness estimation result using the underlying influence model G described above are performed. In order to improve the accuracy of the underlying influence model G to some extent, it is considered that the number of data for creating the underlying influence model G is about several dozens, but is not limited to the number.

In some embodiments, the underlying influence model G may be corrected at a predetermined interval. For example, when the number of wafers W processed in the coating/developing apparatus 2 exceeds a predetermined number, it may be configured that the underlying influence model G is recreated using information related to the latest several dozens of wafers W, and is reflected in the estimation of the film thickness of the subsequent wafers W. As described above, the timing of creating the underlying influence model G, its change or the like may be appropriately changed in consideration of the operation state of the coating/developing apparatus 2, the characteristics of the wafer W, or the like.

In addition, the data used in creating the underlying influence model G is not limited to one for one wafer W. Since the film thickness estimation using the film thickness estimation model F is performed for, for example, each shot, the underlying influence model G may be created by taking the estimation result for each of these pixels.

[Operations]

According to the shape characteristic value estimation apparatus (film thickness estimation apparatus) and the shape characteristic value estimation method (film thickness estimation method) described above, first, the film thickness of the target film is estimated using the film thickness estimation model. Subsequently, the underlying influence model, which is a model associated with the correlation between the difference between the film thickness estimation result of the target film and the film thickness value of the target film acquired without using the film thickness estimation model, and the information related to the color of the surface of the underlying substrate included in the underlying image, is created. Then, the estimation result is corrected based on the underlying influence model. With this configuration, it is possible to correct the variation component of the estimation result derived from the color of the underlying substrate, or the like based on the underlying influence model. Therefore, it is possible to more accurately estimate the film thickness of the target film formed on the substrate.

In addition, since the underlying influence model can be more accurately created by setting the film thickness value of the target film used when creating the underlying influence model as the measured value of the film thickness of the substrate on which the target film is formed, it is possible to more accurately estimate the film thickness of the target film formed on the substrate.

However, even when the measured value is not used, the film thickness value can be more accurately obtained depending on the operation state of the coating/developing apparatus 2 or the accuracy of means different from the actual measurement of the substrate. Even in this case, it is possible to achieve the same effects as those of the measured value.

Furthermore, when the film thickness estimation model is a model created based on the information related to the color of the surface of the underlying substrate included in the underlying image, the influence of the color of the underlying substrate is taken into consideration to some extent in the film thickness estimation result by the film thickness estimation model. Therefore, the accuracy of the estimation result using the film thickness estimation model is also considered to be sufficiently good. Then, by further performing the correction using the underlying influence model, the variation component of the estimation result derived from the color of the underlying substrate, which cannot be completely recognized by the film thickness estimation model, can be further corrected. This makes it is possible to further improve the accuracy of the estimation result.

Furthermore, the aforementioned shape characteristic value estimation apparatus (film thickness estimation apparatus), which has the underlying image acquisition part 101, creates the underlying influence model using the information related to the surface of the underlying substrate included in the underlying image acquired by the underlying image acquisition part 101. In this case, the underlying influence model can be created by using the information related to the surface of the underlying substrate, which is not influenced by the film thickness to be processed at all. Thus, it is possible to more accurately create the underlying influence model.

[Regarding a Case where the Shape Characteristic Value is CD]

In the aforementioned embodiment, there has been described the case where the "shape characteristic value" is the film thickness of the target film, but a critical dimension (CD) such as a line width may be used as the shape characteristic value as described above. In this case, it is possible to estimate the CD by the same method as described above. Specifically, the CD of the target film is estimated using an estimation model for estimating the CD. Subsequently, the underlying influence model, which is a model associated with a correlation between a difference between the estimation result of the CD of the target film and the CD of the target film acquired without using the aforementioned estimation model, and the information related to the color of the surface of the underlying substrate included in the underlying image, is created. Then, the estimation result is corrected based on the underlying influence model. With this configuration, it is possible to correct the variation component of the estimation result derived from the color of the underlying substrate based on the underlying influence model, and to more accurately estimate the CD of the target film formed on the substrate. In the following, after describing the point that the CD can be estimated by using the method described in the estimation of the film thickness, changes from the estimation of the film thickness when estimating the CD will be described.

The CD of the line width is a minimum width of the pattern of the target film (for example, resist) after development, and is about several nm to several μm. It is assumed herein that the capturing part 33 of the inspection unit U3 used for acquiring the underlying image and the processed image does not have a resolution enough to accurately measure the CD of the pattern from the captured image. In the image captured by the capturing part 33, the color of the pattern portion changes depending on the CD size. Therefore, the information related to the color of the surface (here, a gray value) acquired for each pixel may change depending on the shape of the pattern formed on the target film. Therefore, a CD estimation model, which is a model for estimating CD such as a line width or a hole diameter, can be created by the same method as the film thickness estimation model described in the aforementioned embodiment. Furthermore, the CD estimation using the CD estimation model can be performed in the same manner as the film thickness estimation using the film thickness estimation model.

However, the processing of the target film is not the coating of the target film onto the substrate, but a partial removal of the target film (for example, a development process of the resist film after exposure). Therefore, an unprocessed underlying image of the target film is an image obtained by capturing a region before the target film is removed, i.e., a surface in a state in which the target film has been coated. Furthermore, the processed image is an image obtained by capturing a region after the target film is removed (after pattern formation).

Figure 11A:
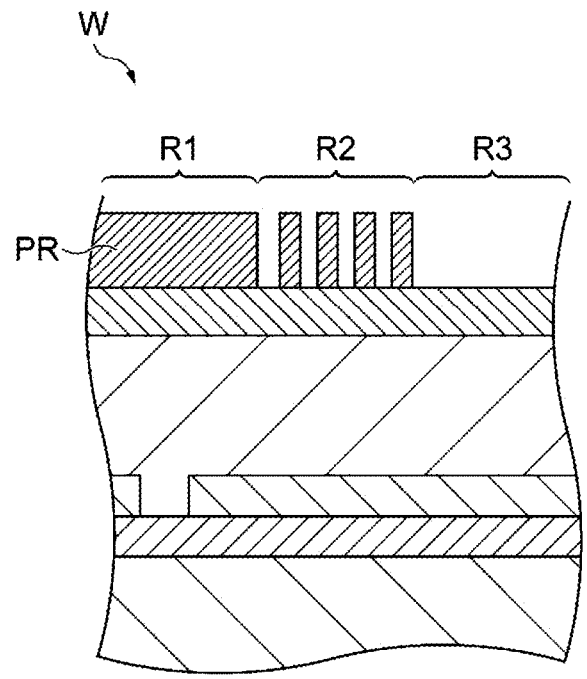
FIGS. 11A and 11B are schematic views illustrating an example of a state of a wafer after a pattern formation process.
Figure 11B:
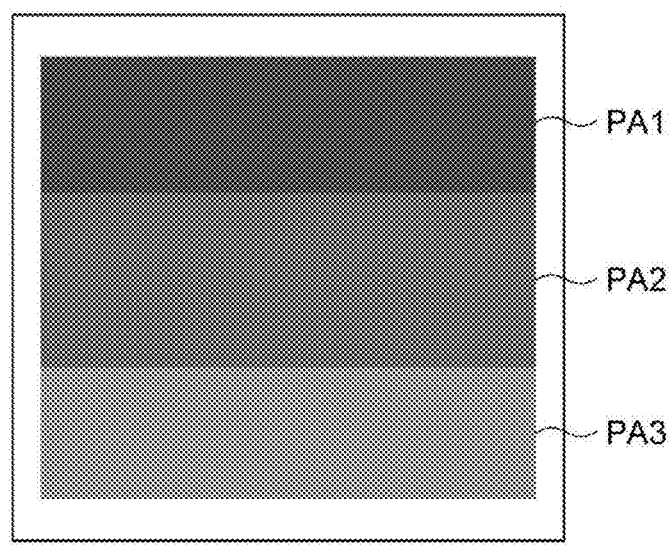

Furthermore, if the processing of the target film is the partial removal of the target film (for example, a development process of the resist film after exposure), a region in which the target film remains on the surface of the wafer after the process (after pattern formation) also exists. This point will be described with reference to FIGS. 11A and 11B. FIG. 11A illustrates a state in which a pattern formed by a resist, which is the target film, is formed on the wafer W. Furthermore, FIG. 11B schematically illustrates a portion of an image obtained by capturing the surface of a wafer having regions as illustrated in FIG. 11A. A state in which a resist film PR is formed on its uppermost surface after a plurality of layers are formed on its lower portion is indicated in FIG. 11A. As illustrated in FIG. 11A, a region R1 in which no pattern is formed on the upper surface of the wafer W after pattern formation, a region R2 in which a pattern is formed thereon, and a region R3 in which no resist exists thereon may exist. The region R1 in which no pattern is formed is a region in which a coated resist remains as it is, and the region R2 in which a pattern is formed is a region in which a portion of the resist is removed. As illustrated in FIG. 11B, an image region PA1 in which the region R1 in which no pattern is formed is captured and an image region PA2 in which the region in which a pattern is formed is captured, and an image region PA3 in which the region in which no resist exists is captured may exist in the image obtained by capturing the wafer W in this state. Among these, the image region PA2 is a region including image information related to the surface of the substrate on which the target film is formed, which is used when estimating the CD, and corresponds to the "processed image".

On the other hand, since the image region PA1 is a region in which the region R1 in which no pattern is formed is captured, it can be said to be a region including the image information related to the surface of the underlying substrate before the target film is formed. Therefore, this region corresponds to the information that has been acquired in the "underlying image". That is, as illustrated in FIG. 11B, the image obtained by capturing the surface of the wafer W after the pattern formation process includes both the image information related to the surface of the substrate on which the target film is formed and the image information related to the surface of the underlying substrate. Therefore, both the information included in the "processed image" and the information included in the "underlying image" can be obtained only from the image obtained by capturing the wafer W after such processing. In this case, both the "shape characteristic value estimation model" and the "underlying influence model" described in the aforementioned embodiment can be formed only from the processed image which is an image obtained by capturing the processed wafer W.

Figure 12A:
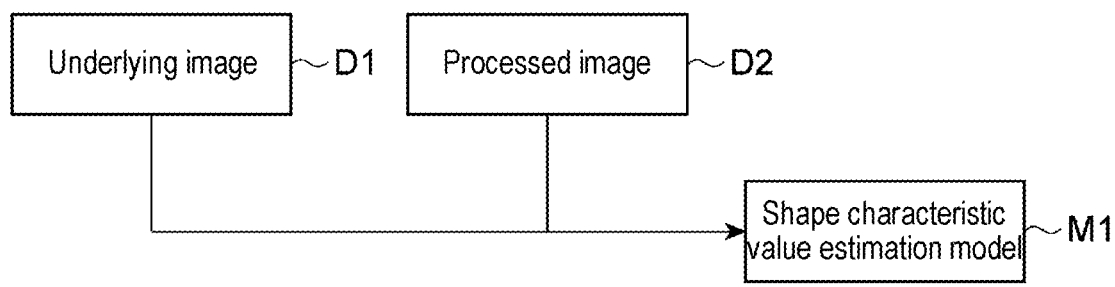
FIGS. 12A and 12B are schematic views illustrating an example of a method of creating a shape characteristic value estimation model.
Figure 12B:
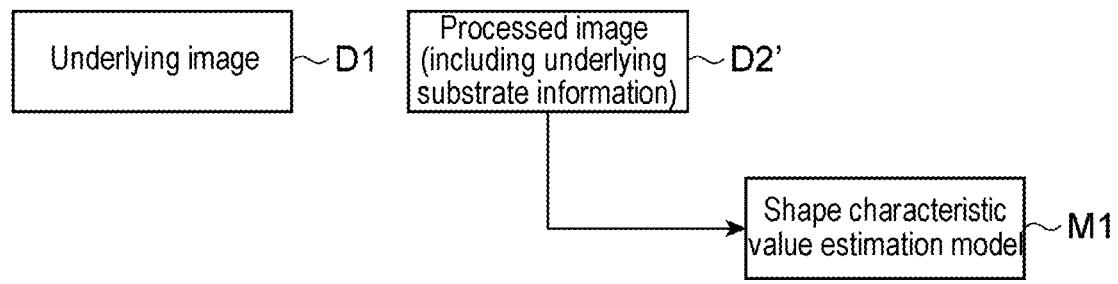

For example, the "shape characteristic value estimation model" is a model associated with the correlation between the information related to the color of each pixel in the image information obtained by capturing the surface of the wafer and the shape characteristic value of the film on the surface of the wafer at the position captured by the pixel. Ideally, the shape characteristic value estimation model can be created based on the information related to the color of the surface of the underlying substrate included in the image information related to the surface of the underlying substrate and the information related to the color of the surface of the processed substrate included in the image information related to the surface of the processed substrate. In this case, as illustrated in FIG. 12A, it is assumed that a shape characteristic value estimation model M1 is created from the image information related to the surface of the underlying substrate included in an underlying image D1 and the image information related to the surface of the processed substrate included in a processed image D2. On the other hand, as described above, if the image region PA1 obtained by capturing the region R1 after processing and the image region PA2 obtained by capturing the region before processing exist in the image obtained by capturing the processed wafer W, the underlying image D1 may not be used. For example, as illustrated in FIG. 12B, the shape characteristic value estimation model M1 may be created by acquiring the image information related to the surface of the unprocessed underlying substrate and the image information related to the surface of the processed substrate from the processed image D2' including the state of the surface of the substrate before and after processing. In the case of the example illustrated in FIG. 12B, since only one image is used to create the shape characteristic value estimation model M1 but the model is created by acquiring two kinds of image information from one processed image D2', it is possible to create the model with the same accuracy as the example illustrated in FIG. 12A. Furthermore, if the image information related to the surface of the unprocessed underlying substrate is acquired from the processed image D2' (in the case of the example illustrated in FIG. 12B), the accuracy may be changed depending on the specification of the region in which the underlying substrate is captured, the size of its area, or the like.

The "underlying influence model" may also be handled in the same manner as the shape characteristic value estimation model. As described above, the "underlying influence model" is a model for estimating how much the difference in the underlying portion influences the estimation result of the film thickness. Specifically, as illustrated in FIG. 13A, for the wafer on which the target film is formed, a residual value is obtained by acquiring an estimation result (estimated value) of a shape characteristic value using the shape characteristic value estimation model and a shape characteristic value (true value) obtained by a method that does not use the shape characteristic value estimation model. Furthermore, in the aforementioned embodiment, as illustrated in FIG. 13A, there has been described a case where an underlying influence model M2 is created by using the image information related to the surface of the underlying substrate included in the underlying image D1 as the image information of the surface of the wafer before the target film is formed. On the other hand, when there is the processed image D2' including the state of the surface of the substrate before and after processing, the underlying influence model M2 may be created by acquiring the image information related to the surface of the unprocessed underlying substrate from the processed image D2'. As described above, the image information related to the surface of the underlying substrate used in the underlying influence model M2 may be acquired from either the underlying image D1 or the processed image D2'. For example, if the image related to the surface of the underlying substrate in a state before the formation of the target film such as coating and pattern formation of the target film can be acquired, the underlying influence model can be created.

Furthermore, as in the processed image D2' illustrated in FIGS. 12A and 12B, and 13A and 13B, if the image information related to the surface of the unprocessed underlying substrate and the image information related to the surface of the processed substrate are obtained from the image obtained by capturing the surface of the processed wafer, the configuration described in the aforementioned embodiment can be implemented without using the underlying image D1. That is, both the shape characteristic value estimation model M1 and the underlying influence model M2 can be created by using only the processed image D2'. Therefore, even if the acquisition of the underlying image D1 is omitted in the coating/developing apparatus 2, the characteristic value related to the shape of the target film formed on the substrate can be accurately estimated. In this case, the capturing itself of the unprocessed wafer W in the inspection unit U3 may be omitted. In this manner, when creating the underlying influence model using the information related to the color of the surface of the underlying substrate included in the processed image D2', the underlying influence model can be creased without additionally preparing a configuration for acquiring the information related to the color of the surface of the underlying substrate. Thus, it is possible to create the underlying influence model with a simpler device configuration.

However, even when the image information related to the surface of the unprocessed underlying substrate and the image information related to the surface of the processed substrate are included in the processed image D2', it is needless to say that the aforementioned model may be created by using the underlying image D1.

Other Embodiments

Although various exemplary embodiments have been described above, various omissions, substitutions, and modifications may be made without being limited to the aforementioned exemplary embodiments. In addition, elements in different embodiments may be combined to form different embodiments.

For example, in the aforementioned embodiments, there has been described the case where the shape characteristic value of the target film is a "film thickness" or a "critical dimension", but the shape characteristic value is not limited to two described above. The method described in the present embodiments may be applied to a shape characteristic value having a correlation with the color of the surface of the wafer W.

For example, in the aforementioned embodiments, there has been described the case where the inspection unit U3 is installed in each of the processing modules 11, 12, and 13. However, the inspection unit U3 is not installed in each module but may be installed independently of each module.

Furthermore, the films formed by the processing modules 11, 12, and 13 described above are an example, and may be appropriately modified. For example, the films may also be formed above the resist film. That is, the inspection method of the films described in the present embodiments is not limited to the kind and number of the films but may be applied to various films formed on the substrate.

According to the present disclosure in some embodiments, it is possible to provide a technique for accurately estimating a characteristic value related to a shape of a target film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The associated with claims and their equivalents are intended to cover such forms or modifications as would fall within the scope and spirit of the disclosures.

What is claimed is:

1. A shape characteristic value estimation apparatus, comprising:
    a processed-image acquisition part configured to acquire a processed image including image information related to a surface of a substrate on which a target film is formed;
    an estimation part configured to estimate a shape characteristic value of the target film, by applying, to the processed image, an estimation model for estimating the shape characteristic value of the target film, the estimation model being associated with a correlation between information related to a color of the surface of the substrate included in the processed image and the shape characteristic value, wherein the shape characteristic value is a characteristic value related to a shape of the target film formed on the substrate;
    an underlying influence model creation part configured to create an underlying influence model which is a model associated with a correlation between a difference between an estimation result of the shape characteristic value of the target film by the estimation part and a shape characteristic value of the target film acquired without using the estimation model, and information related to a color of a surface of an underlying substrate which is a substrate before the target film is formed, and
    an estimated-result correction part configured to correct the estimation result of the shape characteristic value of the target film by the estimation part based on the underlying influence model.

2. The shape characteristic value estimation apparatus of claim 1, wherein the shape characteristic value of the target film acquired without using the estimation model is a measured value of the shape characteristic value of the substrate on which the target film is formed.

3. The shape characteristic value estimation apparatus of claim 1, wherein the estimation model is a model created based on the information related to the color of the surface of the underlying substrate.

4. The shape characteristic value estimation apparatus of claim 1, further comprising: an underlying image acquisition part configured to acquire an underlying image including the image information related to the surface of the underlying substrate,
    wherein the underlying influence model creating part is configured to create the underlying influence model using the information related to the color of the surface of the underlying substrate included in the underlying image.

5. The shape characteristic value estimation apparatus of claim 1, wherein the underlying influence model creation part is configured to create the underlying influence model by using the information related to the color of the surface of the underlying substrate included in the processed image.

6. A shape characteristic value estimation method of estimating a shape characteristic value, which is a characteristic value related to a shape of a target film formed on a substrate, the method comprising:
    acquiring a processed image including image information related to a surface of the substrate on which the target film is formed;
    estimating a shape characteristic value of the target film, by applying, to the processed image, an estimation model for estimating the shape characteristic value of the target film, the estimation model being associated with a correlation between information related to a color of the surface of the substrate included in the processed image and the shape characteristic value, wherein the shape characteristic value is a shape characteristic value of the target film formed on the substrate;
    creating an underlying influence model which is a model associated with a correlation between a difference between an estimation result of the shape characteristic value of the target film and a shape characteristic value of the target film acquired without using the estimation model, and information related to a color of a surface of an underlying substrate which is a substrate before the target film is formed; and
    correcting the estimation result of the shape characteristic value of the target film based on the underlying influence model.

7. A non-transitory computer-readable storage medium storing a program that causes an apparatus to perform the shape characteristic value estimation method of claim 6.

* * * * *